(12) United States Patent
Ward et al.

(10) Patent No.: US 6,201,757 B1
(45) Date of Patent: Mar. 13, 2001

(54) SELF-TIMED MEMORY RESET CIRCUITRY

(75) Inventors: M. Dwayne Ward, McKinney; Vikas Agrawal; George B. Jamison, both of Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/376,042

(22) Filed: Aug. 17, 1999

Related U.S. Application Data
(60) Provisional application No. 60/097,237, filed on Aug. 20, 1998.

(51) Int. Cl.[7] ............................................. G11C 8/00
(52) U.S. Cl. .............................. 365/230.05; 365/189.04; 365/210
(58) Field of Search .................. 365/230.05, 230.03, 365/210, 200, 189.04, 196

(56) References Cited

U.S. PATENT DOCUMENTS

| | | | |
|---|---|---|---|
| 4,586,166 | 4/1986 | Shah | 365/154 |
| 4,601,019 | 7/1986 | Shah et al. | 365/200 |
| 4,611,131 | 9/1986 | Shah | 307/449 |
| 4,685,087 | 8/1987 | Shah | 365/227 |
| 4,723,228 | 2/1988 | Shah et al. | 365/230 |
| 4,918,658 | 4/1990 | Shah et al. | 365/227 |
| 5,404,331 | * 4/1995 | McClure | 365/200 |
| 5,596,539 | 1/1997 | Passow et al. | 365/210 |
| 5,881,008 | * 3/1999 | Becker | 365/210 |
| 6,002,633 | * 12/1999 | Oppold et al. | 365/230.03 |

\* cited by examiner

*Primary Examiner*—David Nelms
*Assistant Examiner*—Thong Le
(74) *Attorney, Agent, or Firm*—Wade James Brady, III; Frederick J. Telecky, Jr.

(57) ABSTRACT

A memory timing architecture which very accurately tracks the read and write timing of a memory over a wide range of array sizes, with separate read and write timing circuits. The read reset circuitry uses a plurality of dummy cells to gauge the time necessary to complete the read operation, while the write reset uses a single dummy cell to gauge the time necessary to complete the write operation. These circuits provide for a more accurately-timed feedback signal, which allows for increased speed while at the same time reducing power consumption and heat buildup.

10 Claims, 2 Drawing Sheets

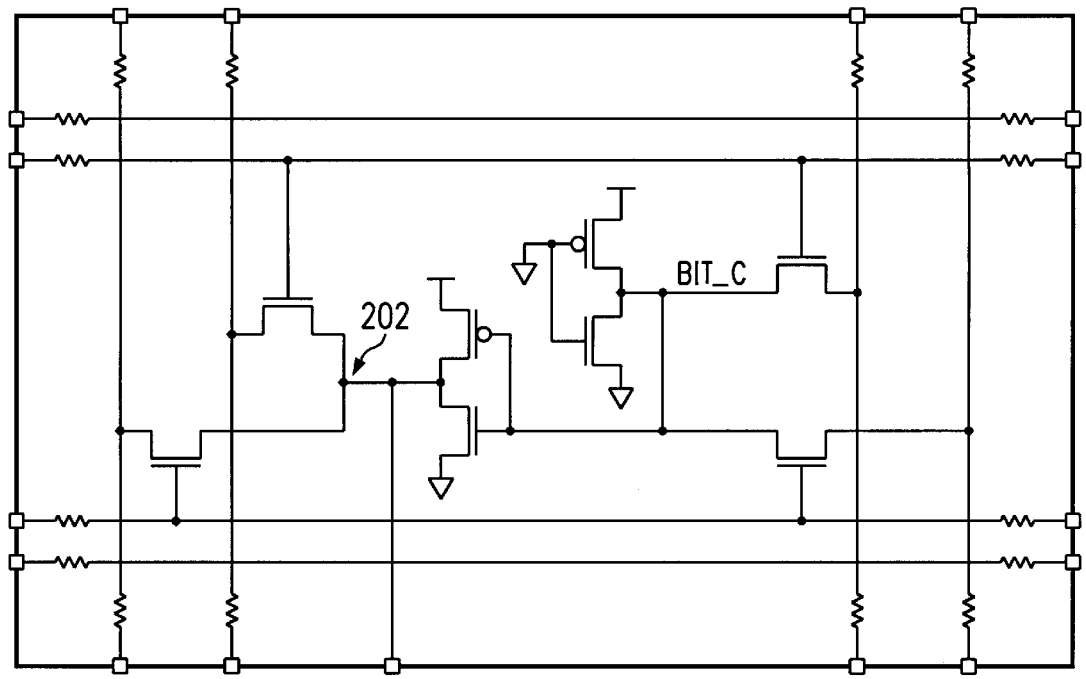
FIG. 2
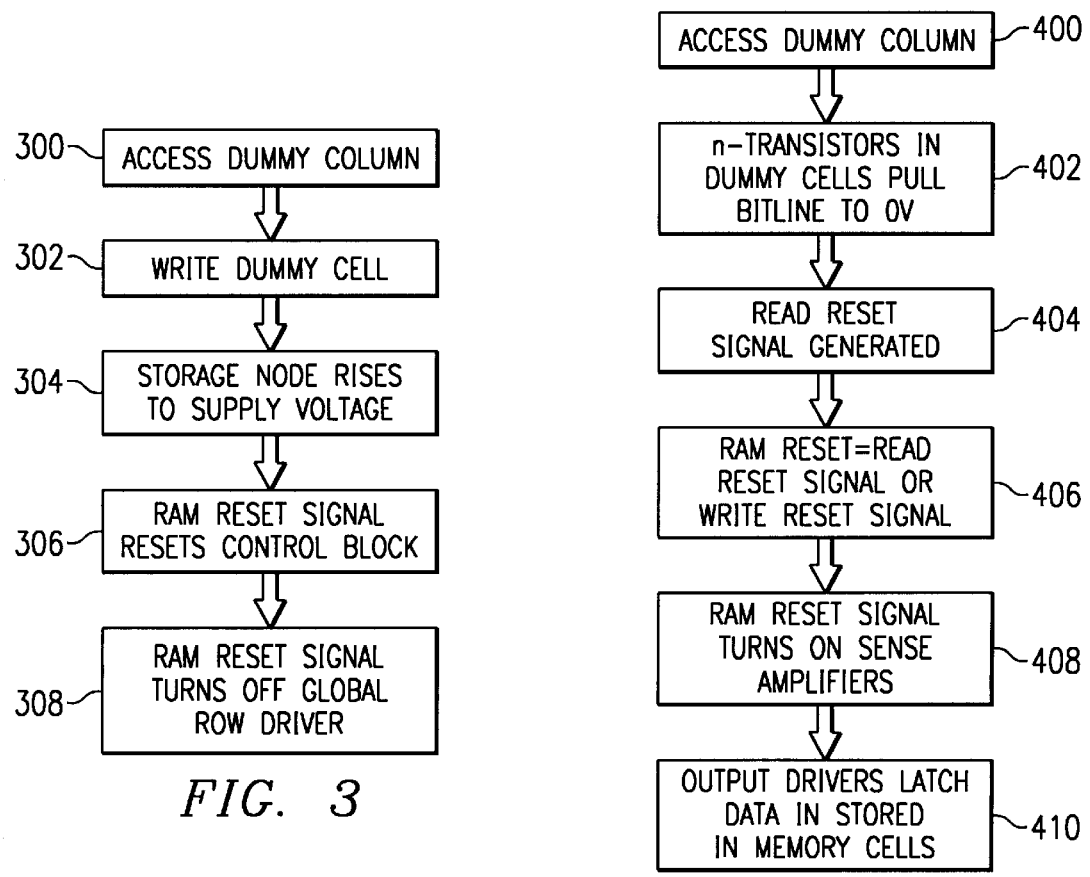
FIG. 3
FIG. 4

SELF-TIMED MEMORY RESET CIRCUITRY

This application claims the benefit of U.S. Provisional Application No. 60/097,237 filed Aug. 20, 1998.

BACKGROUND AND SUMMARY OF THE INVENTION

The present application relates to integrated circuit timing architectures, and particularly to memory reset circuitry.

BACKGROUND: DELAYS IN SEMICONDUCTOR CIRCUITS

Integrated circuit fabrication always produces a certain amount of uncontrolled variation in various physical characteristics (such as the thickness of the gate dielectric, the background doping level of the semiconductor surface). Many of these variations cause corresponding variations in the electrical characteristics of the resulting circuits (such as the current drive or switching speed of a minimum-size transistor, or the speed with which a pulse propagates along a minimum-width line). Many of these electrical characteristics will affect the maximum operating speed of the circuit. The maximum operating speed of the circuit will also be affected by external conditions, such as temperature or power supply voltage.

Thus many of the characteristics which limit the maximum operating speed of an integrated circuit are not always easy to predict. However, in many cases timing issues are very important for optimal operation of a circuit.

An example of this is in memory read operations. In the normal read operation of many memories (e.g. high-speed SRAMs), the output of the selected cell is connected to an analog sense amplifier which is in an unstable condition. The sense amplifier includes positive feedback, so that as soon as the selected cell applies even a very small amount of drive to one of the sense amplifier inputs, the sense amplifier will shift all the way to one or the other of its stable states. In this way the analog sense amplifier quickly amplifies the very small signal available from the selected cell. However, timing is important in this operation: if the sense amplifier is enabled too early, it may settle into an unpredictable state (activated by random electrical noise) before the sensed cell can begin to drive the sense amplifier correctly. On the other hand, if the sense amplifier is enabled too late, then the memory will be slower than it might otherwise be.

The delay until the selected cell begins to develop a signal which can correctly drive the sense amplifier is dependent on several factors. Once the address decoder logic has decoded an incoming address and begun to drive the word line, the word line itself imposes a variable delay. (This delay is dependent on the word line's series resistance, and also on the parasitic capacitance seen by the word line.) Similarly, the cell's output drive capabilities are affected by process variations, as is the capacitive (bitline) loading which the selected cell's output must drive. Thus the delay until the sense amplifier can safely be enabled is variable.

As a result of the variability of the array characteristics, engineers traditionally designed arrays timed to the worst possible delay (i.e., what the delay would be if all factors were working against a fast response time). Although this strategy produced reliable arrays, the drawback was that many operations were delayed by the control circuitry well past the point in time at which the array circuitry was effectively settled.

BACKGROUND: THE USE OF DUMMY CELLS IN SELF-TIMED ARRAYS

In order to compensate for fabrication variations and temperature changes in an array, previous designs incorporated "dummy" cells to gauge the time required to read an array cell. The dummy cells are of the same design as the regular memory cells, and should therefore require the same settling time as the regular memory cells. In this scheme, a dummy cell with a certain known state is selected for read at the same time as a regular cell (the state of which is, of course, unknown). At the point in time when the dummy cell returns the proper pre-determined value, the regular cell has settled into a state ready to be read. The scheme works similarly for write operations.

This scheme has several limitations. For one, conventional designs used only a single dummy cell to time the array for both the read and write operations. These designs were inadequate because the dummy cells take the same interval to settle, or to reach a steady voltage, as the regular cells. As a result, the read or write delay is equal to the settling time of the memory cell PLUS the propagation time through the dummy cell feedback circuitry.

The regular core cells are in a state to be accessed even when the voltage in their bitlines is relatively high. (In silicon integrated circuit memories, the bitlines in a memory array normally start high, and are selectively pulled low by an N-channel driver in a selected memory cell.) These voltages are not low enough to drive standard logic gates quickly. Put another way, the cells may be ready to be accessed when their bitlines are at, for instance, 200 mV differential between the complementary bitlines. At this point in time, the voltage across the dummy cells will also be 200 mV. The sense amps connected to the memory array are ready to switch at this differential, but have to wait until the reset signal propagates through the reset circuitry. The propagation time through the feedback circuitry is undesirable extra delay.

With semiconductor memory customers requiring faster and faster arrays, there has been a serious need in the market for self-timing memory circuitry that accurately tracks, without unnecessary delay, the read and write timing of a memory array over a wide range of sizes without redesign.

BACKGROUND: MODULAR MEMORY DESIGN CONSTRAINTS

Memory array design is important far beyond the specific demands of stand-alone memory chips. Modern integrated circuit design often uses libraries of stock design components, such as "standard cells." The most convenient memory technology for use in conjunction with logic is SRAMs, since (unlike DRAMs or floating-gate memories) SRAM cell technology does not require any nonstandard process steps. Moreover, the peripheral circuitry required to make an array of SRAM cells into a useable embedded memory block are relatively simple, and blocks of SRAM memory can be designed to operate at high speed. This is important when such an embedded memory block is in the critical timing path of a special-function chip.

It would be extremely convenient if designers could easily specify whatever size they wanted for an embedded memory block. However, with present-day technologies memory arrays are not fully modular. This may seem surprising, since the array of memory cells is itself merely a repetitious pattern; but the constraint comes from the peripherals. Conventional array timing circuitry must be optimized for a given array size. Because larger arrays tend to react more slowly to the array circuitry, the timing circuitry was timed to accommodate the largest array conceived of at the time the array control circuitry was designed. The result was that while larger arrays were timed appropriately, smaller arrays were much slower than necessary.

POWER SUPPLY SCALING AND SENSITIVITY

Conventional integrated circuit designs typically specify a reasonably tight constraint on the power supply voltage, e.g. plus or minus ten percent. However, as operating voltages are scaled lower, greater tolerances on supply voltage would be desirable. Moreover, a design which can accept a broad range of supply voltage specifications (with appropriate adjustment of speed and power consumption at different supply voltages) would provide a flexible module which would be very convenient for design libraries and for design automation. In a conventional array design, a small change in voltage can significantly change the timing characteristics of an array. Traditional delay schemes, such as inverter chains, must be completely redesigned for any voltage change in the array.

SELF-TIMED MEMORY RESET CIRCUITRY

The preferred embodiment of the invention disclosed herein uses multiple dummy memory cells to track the timing of at least some memory access operations. During a read operation, the multiple dummy memory cells build up a voltage differential at a faster rate than a single cell, so that the feedback signal begins to propagate back through the array control circuitry while the regular memory bitlines are still settling. In this embodiment, the individual components of the dummy memory cells are identical to the regular storage memory cells, except that they are forced to a pre-determined state. The number of memory cells in the dummy column matches the number of storage memory cells in a normal column. The output of the dummy cells in the preferred embodiment is fed directly into a logic gate. Because the dummy cells are connected together in such a way as to build up voltage differential more quickly than individual core cells, the voltage across the dummy cells will fall faster than that of the core cells.

During a read operation, for example, the dummy cells will switch their logic gates just early enough for the feedback signal to propagate through and enable the sense amplifier at a time when the core cells have just risen to a voltage differential sufficient for reliable reading. This architecture tracks the read and write operations of the memory independently and over a wide range of sizes. This memory reset method tracks the fabrication process better and possible localized process variations in the actual memory array are compensated for through the use of a dummy row of memory cells at the top of memory. The design scheme can quickly effect a speedup or slow-down to the access time by increasing or decreasing the number of dummy memory cells incorporated.

One surprising result of the preferred embodiment is that this reset circuit does an excellent job of tracking voltage variations. At about 0.95 V, there is an approximately 65% speed improvement over designs utilizing an inverter chain delay. Additionally, the preferred embodiment tracks actual memory parasitics (resistance and capacitance) which may not be properly accounted for in the inverter chain. The preferred embodiment can also decrease power dissipation by shutting off the sense amplifiers earlier.

When implemented in a multi-port memory, the reset circuit catches any noise/capacitive coupling that can occur if both ports write to the same column. In other words, it catches interaction between adjacent complementary bitlines if opposite data is written by both the ports. This also applies to when one port reads while the other writes.

For large memory arrays, the preferred embodiment effects an improvement in access time, over a inverter chain delay method, of approximately 10 percent. For mid-range arrays, a 10 to 20 percent improvement can be realized. It is in smaller-sized arrays that this invention provides the greatest benefits. On those arrays, a 30 to 70 percent speed improvement can be realized. Furthermore, this speed improvement is achieved without any compromise of the design margins (i.e., the reliability of the array).

Another class of innovative embodiments also uses the dummy cells to provide automatic write timing. In this class of embodiments, the time for a transition to propagate through the dummy cell, from one bitline to the complementary bitline, is a variable delay (dependent on process variables, temperature, and supply voltage), which corresponds to the timing required for a written cell to stabilize. By using multiple paralleled cell units which are each identical to an array cell to form the dummy cell, the beta of each multi-unit dummy cell remains exactly the same as that of the array cells, to provide an accurate match to writing characteristics. ("Beta," in SRAM design, is a term which describes the ratio between the respective W/Ls of the drive and pass transistors in a cell layout.)

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 2 shows a detailed view of the dummy memory cell used for the read and write reset timing.

FIG. 3 shows a flow chart of the operation of the self-timed read/write segregated memory reset circuit during a write operation.

FIG. 4 shows a flow chart of the operation of the self-timed read/write segregated memory reset circuit during a read operation.

DETAILED DESCRIPTION OF THE PREFERRED EMBODIMENTS

Figure 1:
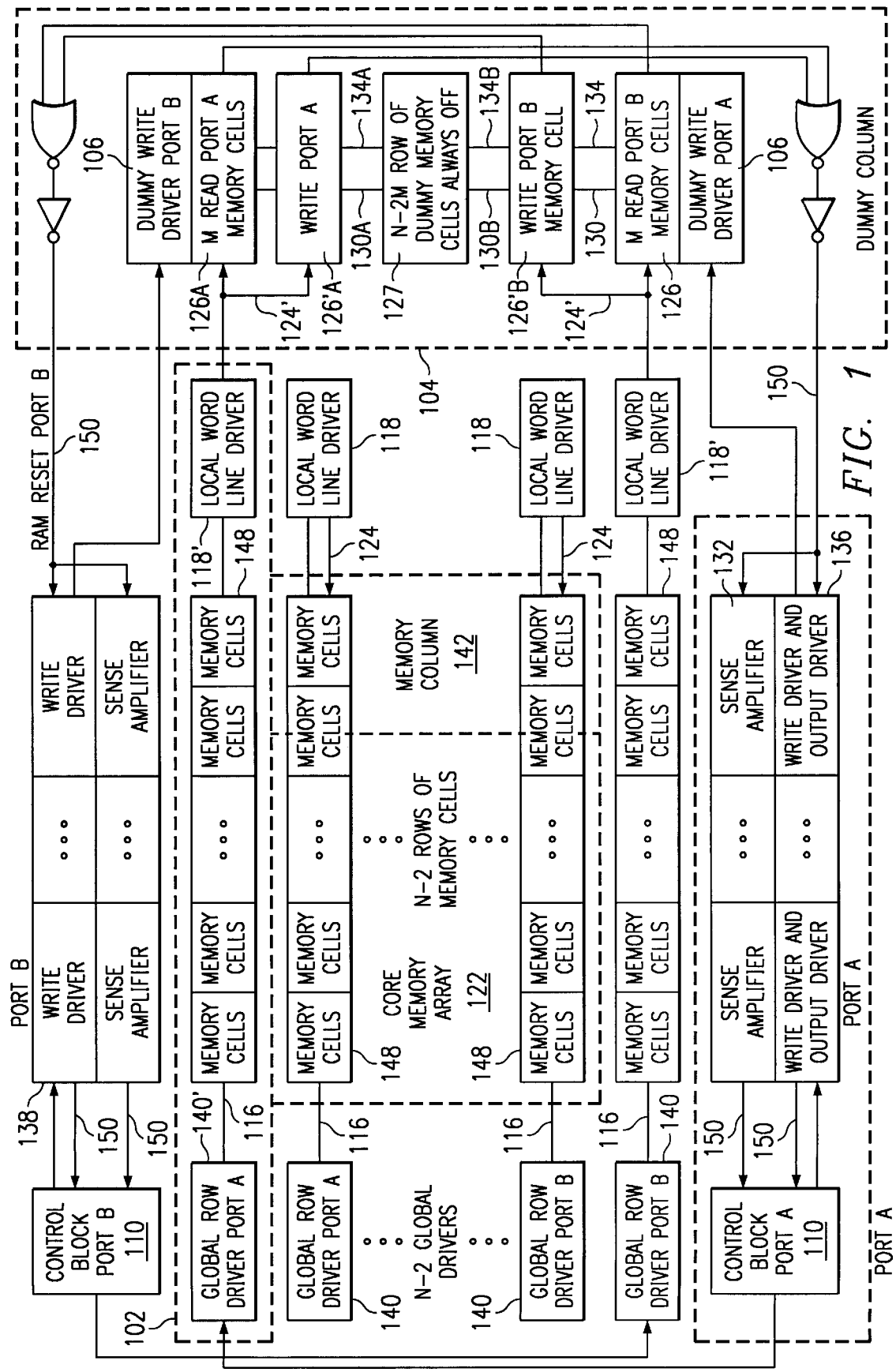
FIG. 1 shows a block diagram of a self-timed read/write segregated memory reset circuit.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

The embodiment of FIG. 1 shows a multi-port memory architecture in which self-timing circuits are used both for read and for write operations. However, the self-timing relations can also be used on the read operation alone, and in fact are expected to be so used in a commercial embodiment.

The self-timed reset circuitry, depicted in FIG. 1, consists of a dummy row 102 for each port, and control and dummy column circuitry 104. The control and dummy column circuitry 104 includes a dummy write driver 106 for each port, complementary bitlines 130 and 134 for each port (labelled as 130A/B and 134A/B), read-timing dummy cells 126A/B, write-timing memory cells 126A/B', and a block of inactive dummy-column-loading cells 127. (These cells 127 assure that the dummy cells 126 and 126' will always see the same bitline parasitic loading as the cells of the core memory array 122.)

Each dummy row 102, in the presently preferred embodiment, includes a dummy row global driver 140', a global wordline 116', a local wordline driver 118, and dummy-row memory cells 148'. (The dummy-row memory cells 148', in the presently preferred embodiment, are identical to the memory cells 148 in the core array 122.)

The control block 110 for each port generates a signal (on the rising edge of the clock, in the presently preferred embodiment) which enables the dummy row global driver 140' at the same time as one of the global row drivers 140 for the selected row in the core memory array 122. (Note that the physical layout is arranged so that each of the dummy rows 102 is the row which is physically furthest from its respective port, to provide worst-case delay.)

The selected global row driver will drive a global wordline 116, to activate one of the local wordline drivers 118 using a local wordline segment 124. (In the presently preferred embodiment there are eight cells per local wordline driver 118, and the local wordline drivers 118 are spaced across the array, one for every eight columns; but for clarity, FIG. 1 shows only the rightmost local drivers 118, and does not show the individual memory cells 148 to the right of the rightmost local driver.)

At the same time, the dummy global row driver 140' asserts the global wordline 116' of the dummy row 102, which always enables the rightmost local wordline driver 118'. The dummy row 102 has the same number of columns 142 as the core memory array 122. The dummy row's local wordline driver 118' asserts the wordline 124' of actual memory cells 126 and 126' in the dummy column 104.

The number M of memory cells which are connected in parallel to provide the read-timing dummy cell 126 for the read reset circuitry is determined by optimum performance and design margin considerations. The total number of rows in the dummy column 104 matches the total number of rows in the core memory array 122. The total number of rows in the core memory array is N+2, where one row at the top and one at the bottom serve as the dummy row 102 for one port (A or B) each. In the dummy column, there are N−2*M rows of dummy memory cells 127 that are always off. In the presently preferred embodiment, there is only one memory cell 126' (per port) for the write reset circuitry.

During the read operation, a certain number of memory cells 126 for each port in the dummy column 104 are accessed. The memory cells 126 remain in a constant, predetermined state. When the pass transistors of these cells 126 are pulled to ground, a predetermined bitline 130 is pulled to ground by the n-type transistors in the memory cells 126, generating the read reset signal. The read reset signal is logically ORed with the write reset signal to generate a RAM reset signal 150. The RAM reset signal 150 turns on the sense amplifiers 132, and the output drivers 136 latch the data stored in the accessed memory cells 148.

During the write operation, the dummy column 104 is accessed while a write memory cell 126', set to a predetermined state, is written to by the write driver 106. Nearly simultaneously, in the memory array, a memory cell 148 in the accessed column 142 is written to by a write driver 138. The write reset is initiated when the storage node (202 in FIG. 2) in the dummy cell 126 rises to the supply voltage. The RAM reset signal 150 resets the control block 110 and turns off the global row driver 140.

The slew rate for the voltage change in a bitline 130 is fairly linear over the read time. For a bitline change of D volts in a normal column, the dummy column 104 develops a voltage equal to M*D, where M is the number of memory cells 126 in the read reset circuitry. In the preferred embodiment, M is equal to 6, so that the dummy column 104 develops a differential of approximately 1.2 V while the normal memory column 142 develops approximately 200 mV. Thus, the sense amplifier 132 is triggered when the voltage differential between the dummy column 104 and the regular memory column 142 reaches 1.0 V. This method tracks the various sizes of the memories very well and has the added advantage of tracking the water fabrication process.

The write process is depicted in flowchart form in FIG. 3. The dummy column is accessed (Box 300) while a single memory cell, set to a predetermined state, is written to by the write driver (Box 302). The write reset is initiated when the storage node in the write reset memory cell rises to the supply voltage (Box 304). The RAM reset signal resets the control block (Box 306) and turns off the global row driver (Box 308).

The read process is depicted in flowchart form in FIG. 4. A certain number of memory cells in the dummy column are accessed (Box 400). A predetermined bitline is pulled to logic zero state by the n-type transistors in the memory cells (Box 402), generating the read reset signal (Box 404). The read reset signal is logically ORed with the write reset signal to generate a RAM reset signal (Box 406). The RAM reset signal turns on the sense amplifiers (Box 408), and the output drivers latch the data stored in the accessed memory cells (Box 410).

According to certain disclosed innovative embodiments, there is provided: An electronic memory structure comprising: a plurality of memory cells; access circuitry connected to access selected ones of said cells; and dummy cells which are connected to automatically determine the timing of said access circuitry under at least some conditions, and which are connected to provide an output drive level which corresponds to, and is greater than, the output drive level of a selected memory cell.

According to certain disclosed innovative embodiments, there is provided: An integrated circuit memory structure, comprising: a plurality of memory cells; access circuitry connected to access selected ones of said cells; and dummy cells which are connected to automatically determine the timing of said access circuitry when said cells are being read, but not when said cells are being written.

According to certain disclosed innovative embodiments, there is provided: An electronic memory structure comprising: a plurality of memory cells; access circuitry connected to access a selected one of said cells, and also a dummy cell which has a greater output drive level than said selected cell; and said selected cell, but not said dummy cell, being connected to have an output thereof amplified by an analog sense amplifier; wherein said sense amplifier is enabled in dependence on the output of said dummy cell.

According to certain disclosed innovative embodiments, there is provided: A memory reading method, comprising the actions of: applying a first selection signal to simultaneously access at least one selected group of memory cells and at least one group of dummy cells; said group of dummy cells and said selected group of memory cells having similar load characteristics as seen by said selection signal; each said groups dummy cell having a respective drive capability which is more than 10% greater than that of said respective group of memory cells; a sense amplifier connected to amplify the output of a selected one of said memory cells; and wherein an output of at least one of said group of dummy cells is connected to enable said sense amplifier only when said output of said at least one dummy cell reaches a predetermined level.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

Although the preferred embodiment is implemented in static RAM, nothing within the invention limits it to any particular form of memory. In alternative embodiments, the disclosed innovations can be implemented in dynamic RAM, ferroelectric RAM, EPROM, flash memory, ROM, or any analogous form of memory in which power consumption and speed are important.

Although the presently preferred embodiment is implemented in dual-port memory, with one complete dummy-dependent timing chain for each port, the disclosed innovations can also be used in memories with more ports and/or with ports of different types. Moreover, in some multiport embodiments some ports can be self-timed and others not.

Although the preferred embodiment has particular advantages for multiple-port memory (since the delays which are dependent on interactions among the wiring for the different memory ports are accurately tracked), it can also be applied to single-port memories.

Although the preferred embodiment uses a voltage sensing scheme for the feedback circuitry, there is nothing in the nature of the invention that prevents the same idea to be implemented in a current sensing scheme. This alternative embodiment can, for example, be useful in floating-gate memories.

Although the preferred embodiment makes use of both global and local wordline drivers, more or fewer levels of wordline segmentation can alternatively be used.

Although the preferred embodiment uses separate read and write reset circuits, the disclosed innovations can also be used there is a single circuit for both the read and write reset.

In the preferred embodiment the dummy cell output goes to a logic gate or a latch; but in alternative embodiments it is contemplated that the dummy output can be fed into a stage which is referenced to the supply voltage (rather than ratioed). In a further alternative, it is contemplated that a sense amplifier can be used on the dummy column, with the dummy column state transition still being used to drive a sense amplifier which enables the array sense amplifier.

For another example, the disclosed innovative principles can also be used with double-cell differential memory architectures (e.g. with doubled FRAMs or other cell technologies), where two memory cells are used per bit of information, and the cells are always programmed into complementary states.

Of course a wide variety of X-and Y-address selection logic implementations can be used.

It should also be noted that, over time, an increasing number of functions tend to be combined into a single chip. The disclosed inventions can still be advantageous even with different allocations of functions among chips, as long as the functional principles of operation described above are still observed.

What is claimed is:

1. An electronic memory structure comprising:
   a plurality of memory cells;
   access circuitry connected to access selected ones of said memory cells; and
   dummy cells which are connected to automatically determine the timing of said access circuitry under at least some conditions, said dummy cells connected to provide an output drive level greater than the output drive level of a selected memory cell.

2. The structure of claim 1, wherein said memory cells are SRAM cells.

3. The structure of claim 1, wherein each said dummy cell includes multiple dummy cell units connected in parallel, and each of said dummy cell unit is identical to one of said memory cells.

4. An integrated circuit memory structure, comprising:
   a plurality of memory cells;
   access circuitry connected to access selected ones of said cells; and
   dummy cells which are connected to automatically determine the timing of said access circuitry when said cells are being read, but not when said cells are being written.

5. The structure of claim 4, wherein the array is an static RAM array.

6. The structure of claim 4, wherein each said dummy cell includes multiple dummy cell units connected in parallel, and each of said dummy cell units is substantially identical to one of said memory cells, except that they have a predetermined fixed state.

7. The structure of claim 4, wherein the circuit structure is a multiport memory array.

8. The structure of claim 4, wherein said access circuitry utilizes separate sets of dummy cells for read and write operations.

9. An electronic memory structure comprising:
   a plurality of memory cells;
   access circuitry connected to access a selected one of said cells, and also a dummy cell which has a greater output drive level than said selected cell; and
   said selected cell, but not said dummy cell, being connected to have an output thereof amplified by an analog sense amplifier;
   wherein said sense amplifier is enabled in dependence on the output of said dummy cell.

10. A memory reading method, comprising the actions of:
    applying a first selection signal to simultaneously access at least one selected group of memory cells and at least one group of dummy cells;
    said group of dummy cells and said selected group of memory cells having similar load characteristics as seen by said selection signal;
    each said groups dummy cell having a respective drive capability which is more than 10% greater than that of said respective group of memory cells;
    a sense amplifier connected to amplify the output of a selected one of said memory cells; and
    wherein an output of at least one of said group of dummy cells is connected to enable said sense amplifier only when said output of said at least one dummy cell reaches a predetermined level.

* * * * *